(12) United States Patent
Kim et al.

(10) Patent No.: US 7,973,302 B2
(45) Date of Patent: Jul. 5, 2011

(54) FORMING PHASE CHANGE MEMORY CELLS

(75) Inventors: Yudong Kim, Cupertino, CA (US); Fabio Pellizzer, Cornate D'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 144 days.

(21) Appl. No.: 12/346,666

(22) Filed: Dec. 30, 2008

(65) Prior Publication Data

US 2010/0163827 A1  Jul. 1, 2010

(51) Int. Cl.
 *H01L 29/02* (2006.01)
 *H01L 47/00* (2006.01)
 *H01L 29/04* (2006.01)

(52) U.S. Cl. ............ 257/3; 257/2; 257/E47.001

(58) Field of Classification Search .......... 257/2, 3, 257/E47.001
See application file for complete search history.

(56) References Cited

U.S. PATENT DOCUMENTS

| | | | |
|---|---|---|---|
| 7,422,926 B2 | 9/2008 | Pellizzer et al. | |
| 2006/0226409 A1* | 10/2006 | Burr et al. | 257/2 |
| 2006/0257787 A1* | 11/2006 | Kuo et al. | 430/270.13 |
| 2007/0020797 A1* | 1/2007 | Pellizzer et al. | 438/95 |
| 2007/0279974 A1* | 12/2007 | Dennison et al. | 365/163 |

* cited by examiner

*Primary Examiner* — Alexander G Ghyka
*Assistant Examiner* — Seahvosh J Nikmanesh
(74) *Attorney, Agent, or Firm* — Lisa K. Jorgenson; Robert Iannucci; Seed IP Law Group PLLC (57) ABSTRACT

Small phase change memory cells may be formed by forming a segmented heater over a substrate. A stop layer may be formed over the heater layer and segmented with the heater layer. Then, sidewall spacers may be formed over the segmented heater to define an aperture between the sidewall spacers that may act as a mask for etching the stop layer over the segmented heater. As a result of the etching using the sidewall spacers as a mask, sublithographic pore may be formed over the heater. Phase change material may be formed within the pore.

15 Claims, 10 Drawing Sheets

FORMING PHASE CHANGE MEMORY CELLS

BACKGROUND

1. Technical Field

The present invention relates generally to phase change memories that use chalcogenide materials.

2. Description of the Related Art

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

Scaling of phase change memory cells is often limited by registration requirements for lithography pattern transfer over multiple critical layers for the memory cell construction.

Thus, it would be desirable to devise a process for manufacturing phase change memory cells that potentially reduces the number of critical lithography steps.

BRIEF SUMMARY

One embodiment is a process for manufacturing a phase-change memory device that potentially allows to reduce the number of critical layers.

The description refers to two schemes wherein the memory regions are formed on top of segmented heater walls, with a sub-lithographic heater/chalcogenide interface area defined by using a spacer technique.

One embodiment uses metallic spacers instead a metallic cap layer, e.g., of Ti/TiN, created in prior art methods using lithography and etch steps.

Another embodiment utilizes etch-back of chalcogenide material combined with deposition and planarization of a metallic cap layer through CMP (Chemical Mechanical Polishing).

DETAILED DESCRIPTION

In accordance with one embodiment, a raised emitter array may be formed in between bases to form a bipolar junction transistor select device. However, in other embodiments, other select devices may be utilized, including chalcogenide select devices, such as ovonic threshold switches, diode select devices, and transistor select devices.

Figure 1:
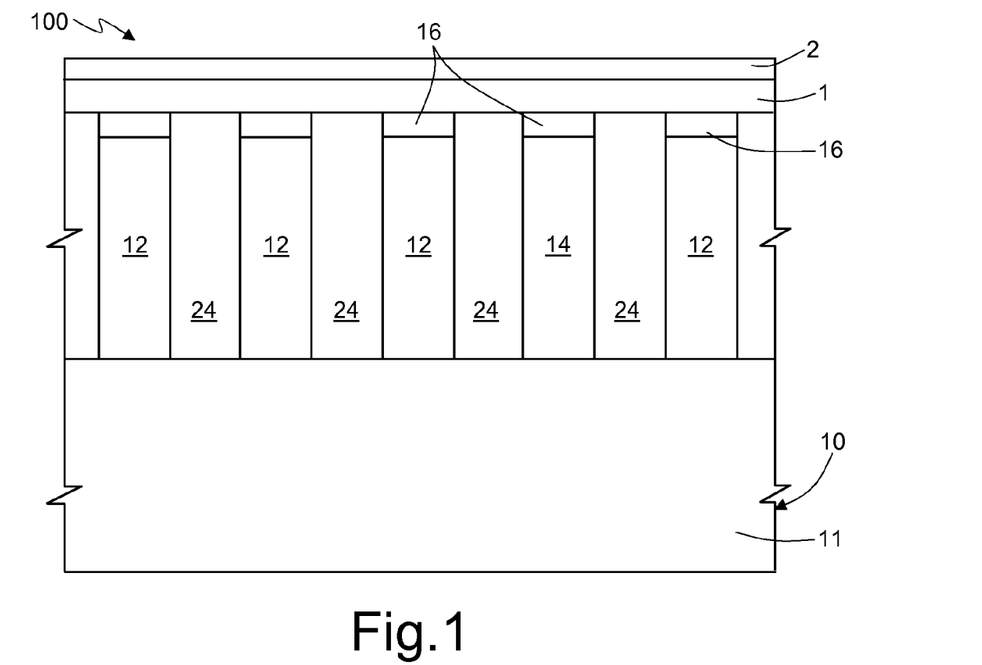
FIGS. 1, 2 are enlarged, cross-sectional views of one embodiment in two manufacturing steps along a direction X.

Referring to FIG. 1, a base substrate 10 has active areas 11 therein accommodating electric components. Raised emitters 12 and raised bases 14 are formed on the substrate. An intervening dielectric material 24 may separate the raised bases and emitters. A salicide 16 may be formed over the raised bases 14 and raised emitters 12.

Figure 2:
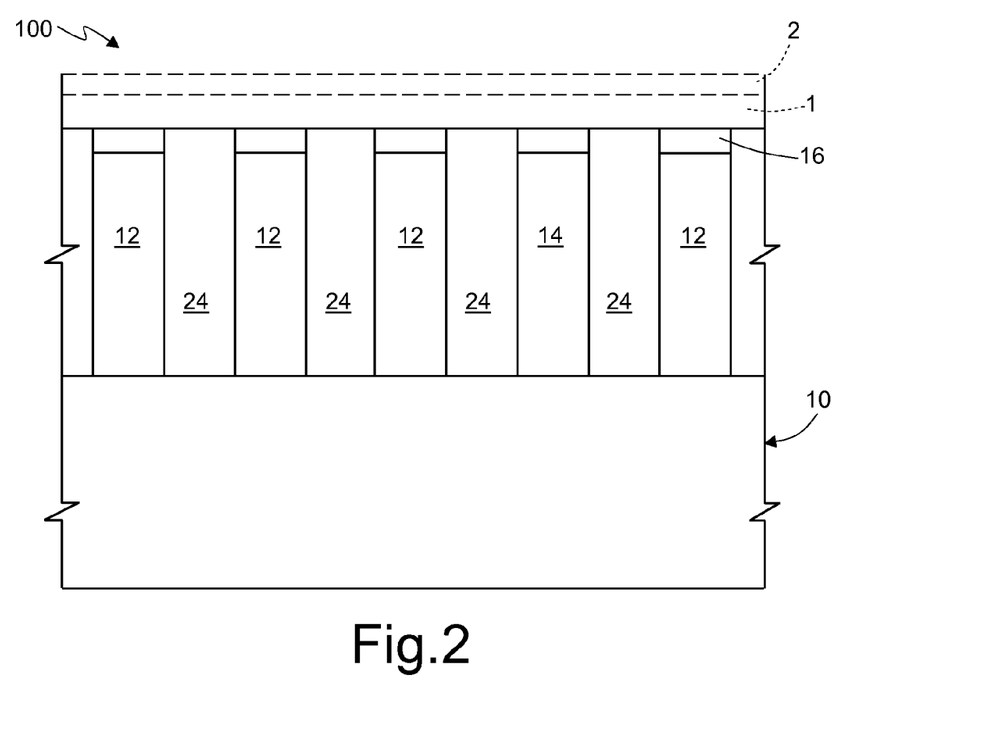
Figure 3:
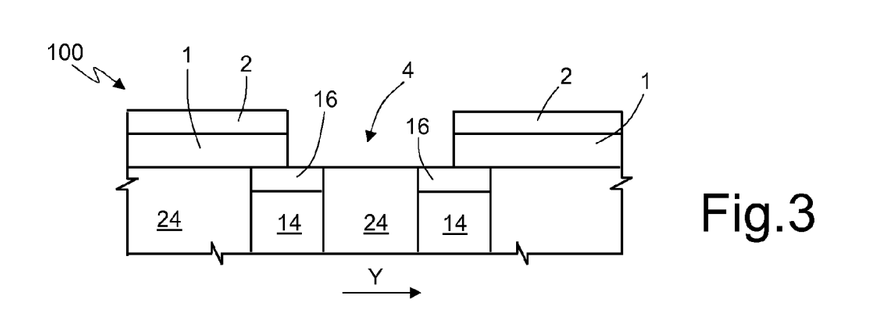
FIG. 3 is an enlarged cross-sectional view of one embodiment, along a direction Y.
Figure 4:
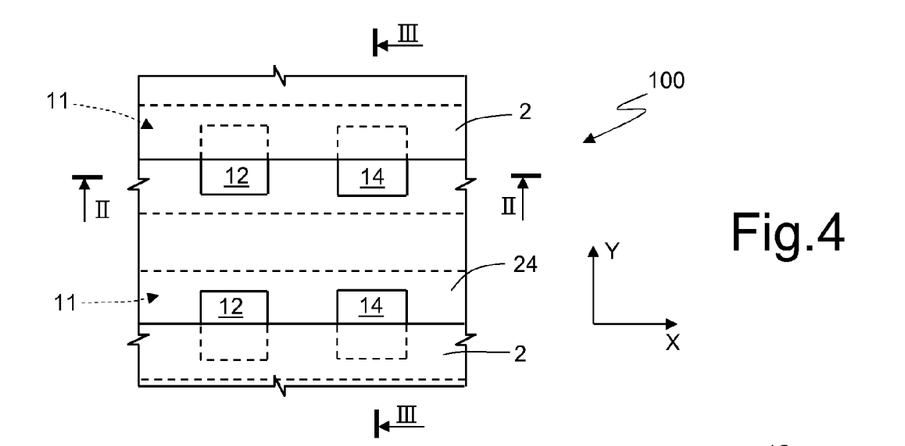
FIG. 4 is a top plan view.

Thereover, a silicon nitride layer 1 and an oxide layer 2 are deposited. Then, FIGS. 2-4, heater trenches 4 are opened in the oxide layer 2 and in the silicon nitride layer 1. The heater trenches 4 are substantially rectilinear and extend e.g., in the row direction X, exposing only about half of the raised bases 14 and of the raised emitters 12. In particular, each heater trench 4 exposes the facing portions of the raised bases 14 and emitters 12 belonging to two adjacent rows and covers the other two portions of the same raised bases 14 and emitters 12, as disclosed in, e.g., U.S. Pat. No. 7,422,926.

Figure 5:
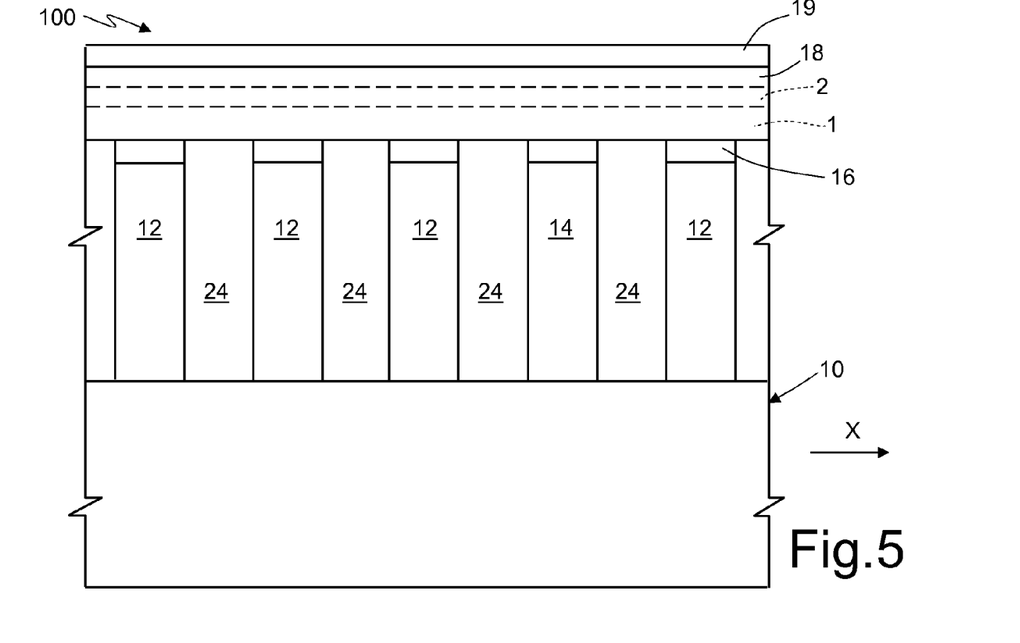
FIG. 5 is an enlarged cross-sectional view in a subsequent manufacturing step along direction X.
Figure 6:
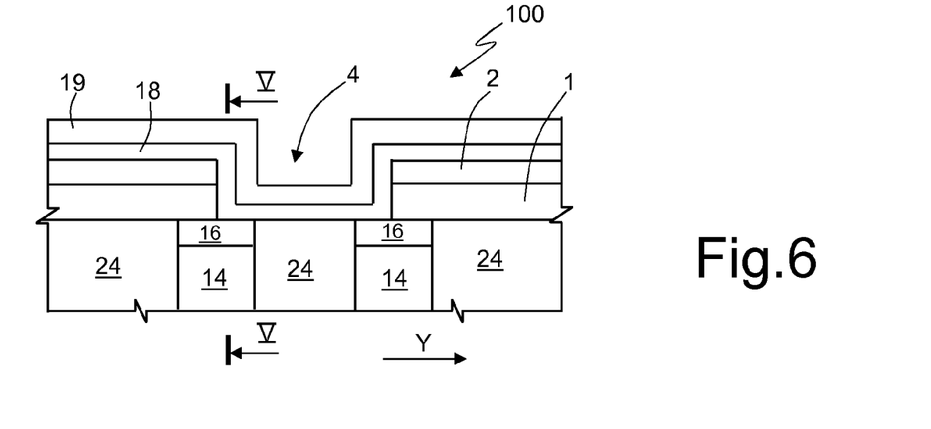
FIG. 6 is an enlarged cross-sectional view of one embodiment, along direction Y.

Then, FIGS. 5-6, a heater layer 18 and, optionally, a dielectric sheath layer 19, both having sublithographic thickness, are conformally deposited. The heater layer 18 may be formed, for example, from titanium silicon nitride. However, other heater materials may also be used. Moreover, preferably, the thickness of the heater layer 18 is in the range of 5-20 nm.

Figure 7:
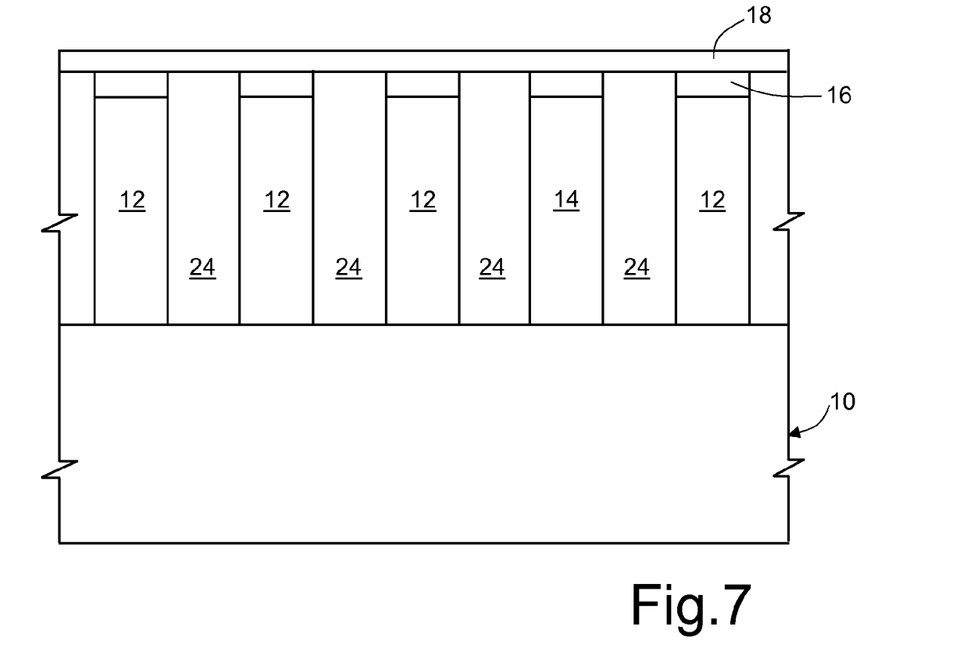
FIG. 7 is an enlarged cross-sectional view in a subsequent manufacturing step along the direction X.
Figure 8:
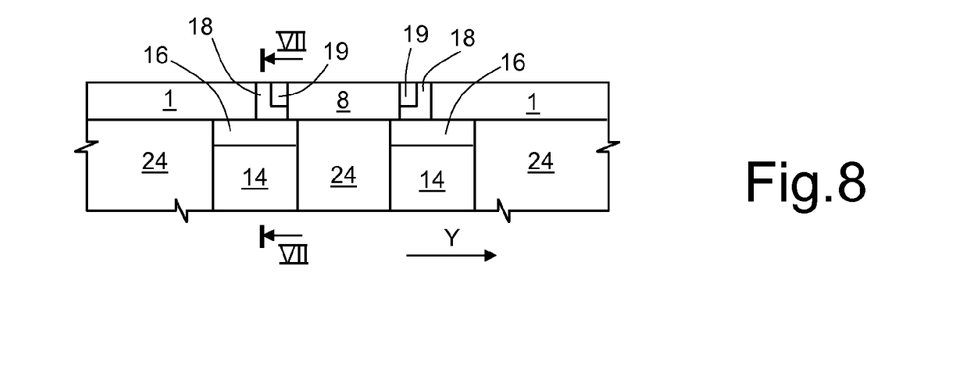
FIG. 8 is an enlarged cross-sectional view of one embodiment, along direction Y.

The heater layer 18 and the sheath layer 19 are etched back and flat portions thereof are removed from the bottom of the heater trench 4 (FIG. 8). In practice, vertical portions of the heater layer 18 and of the sheath layer 19 adhering to sides of the heater trenches 4 are separated from each other and define L-shaped heater walls 18 running parallel to the row direction X. A filling layer 8 (e.g., oxide) is deposited on the wafer 100. Then, the excess filling layer 8 and the oxide layer 2 are etched back down to the nitride layer 1, as shown in FIGS. 7 and 8.

Figure 9:
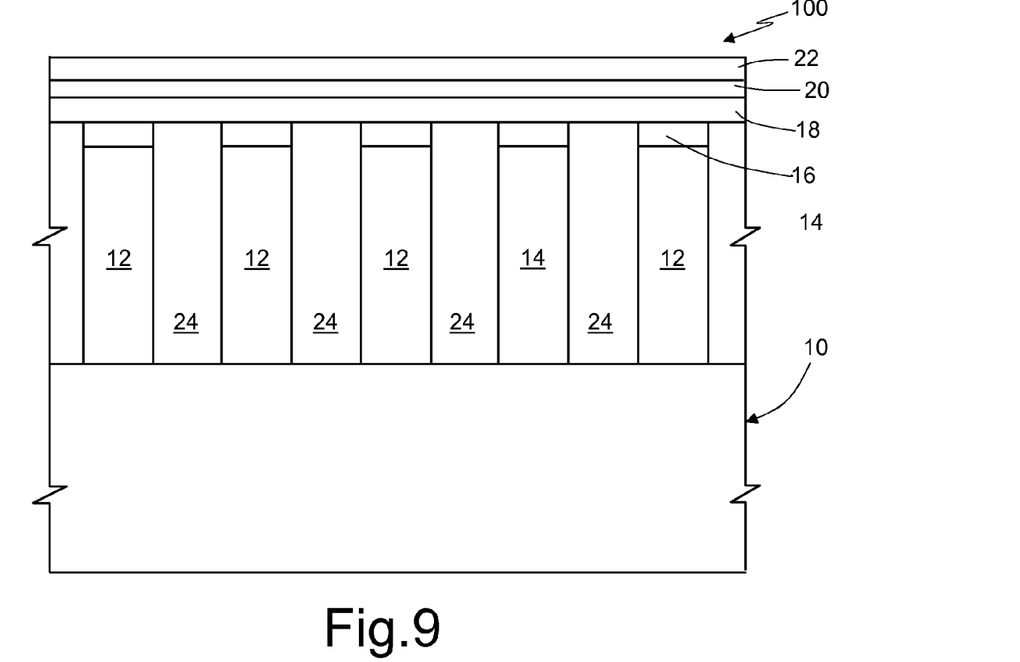
FIGS. 9-10 are enlarged cross-sectional views in subsequent manufacturing steps along direction X.

Thereover, FIG. 9, a stop layer 20 and a sacrificial layer 22 are formed.

The stop layer 20 may be formed of a variety of insulating materials. In one embodiment, the stop layer 20 may be oxide, in another embodiment, the stop layer 20 is of nitride and oxide. In one embodiment, the sacrificial layer 22 is a nitride layer. The sacrificial layer 22 can be any material that is selectively etchable with respect to the stop layer 20.

Figure 10:
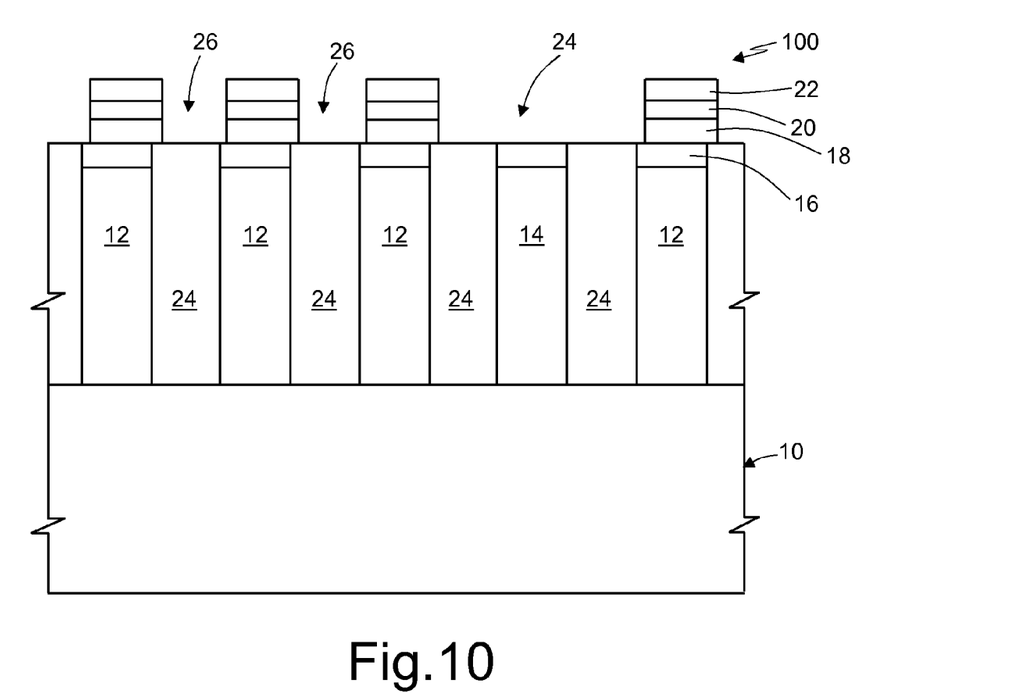
Figure 11:
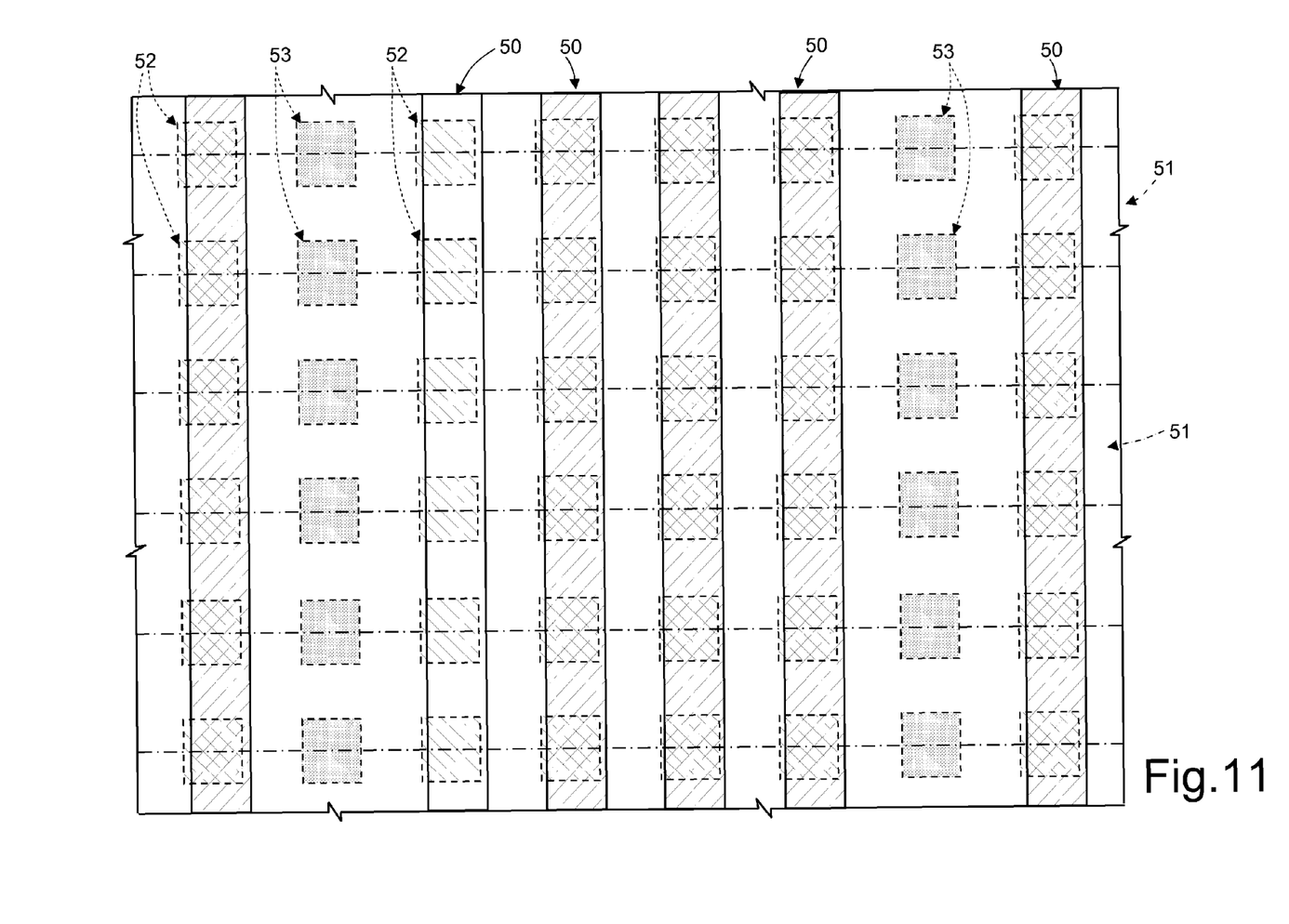
FIG. 11 is a top plan view.

In accordance with FIGS. 10 and 11, a segmented heater lithography and etch is done to segment the heater walls 18 on top of the emitters and bases, landing on the emitter base salicide 16. FIG. 11 shows the segmented heater mask 50, overlaid to a MBIT mask 51 used to form the heater trenches 4 of FIGS. 3-4. Also shown are an emitter mask 52 and a base mask 53. In the embodiment, the segmented heater mask 50 extends transversely to the MBIT mask 51. For example, it is perpendicular. The sacrificial layer 22 may be patterned and etched to serve as a mask when etching the heater walls 18 and the stop layer 20. The etch proceeds all the way down to the emitter base structure. As a result, the heater layer 18 is now segmented to define segmented heaters 18.

Figure 12:
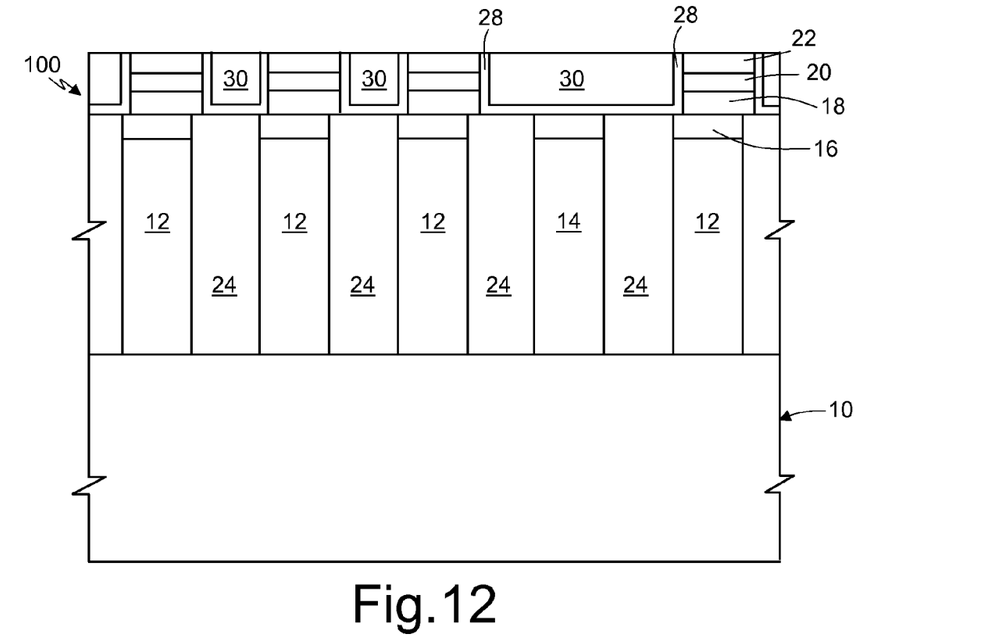
FIGS. 12-16 are enlarged cross-sectional views in subsequent manufacturing steps along direction X.

Then, referring to FIG. 12, a passivation layer 28 may be deposited to protect the exposed heater edge along the segmented heater stack. The passivation layer 28 may be an insulator such as nitride. Then, a dielectric fill 30 may be done, followed by chemical mechanical planarization to planarize the surface, stopping on the sacrificial layer 22.

Figure 13:
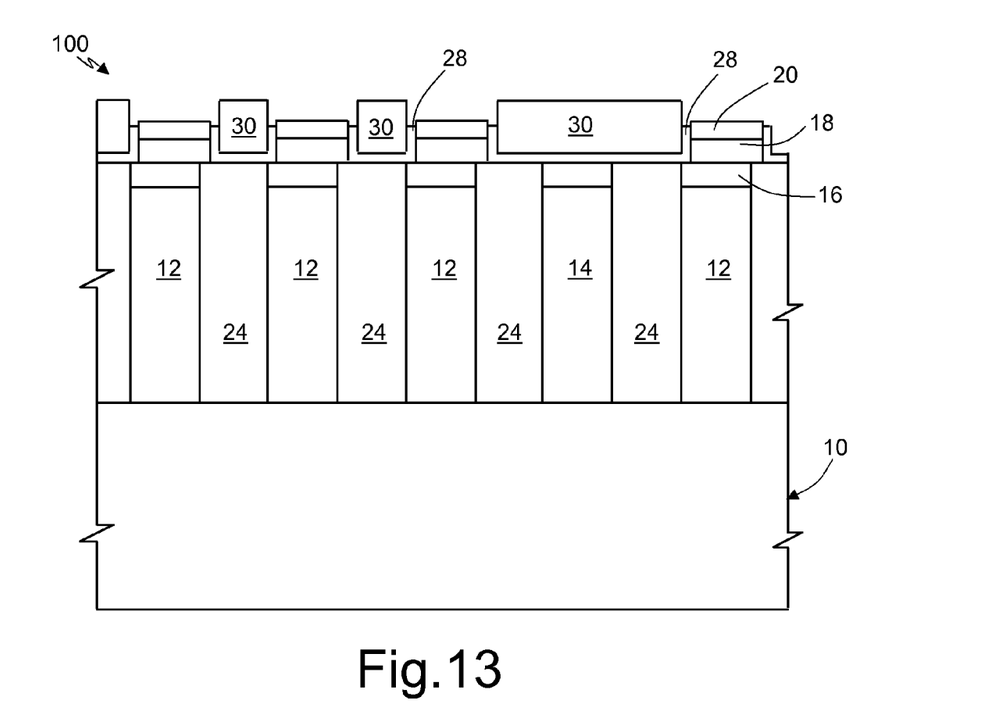

Turning now to FIG. 13, the sacrificial layer 22 may be removed, stopping on the stop layer 20.

Figure 14:
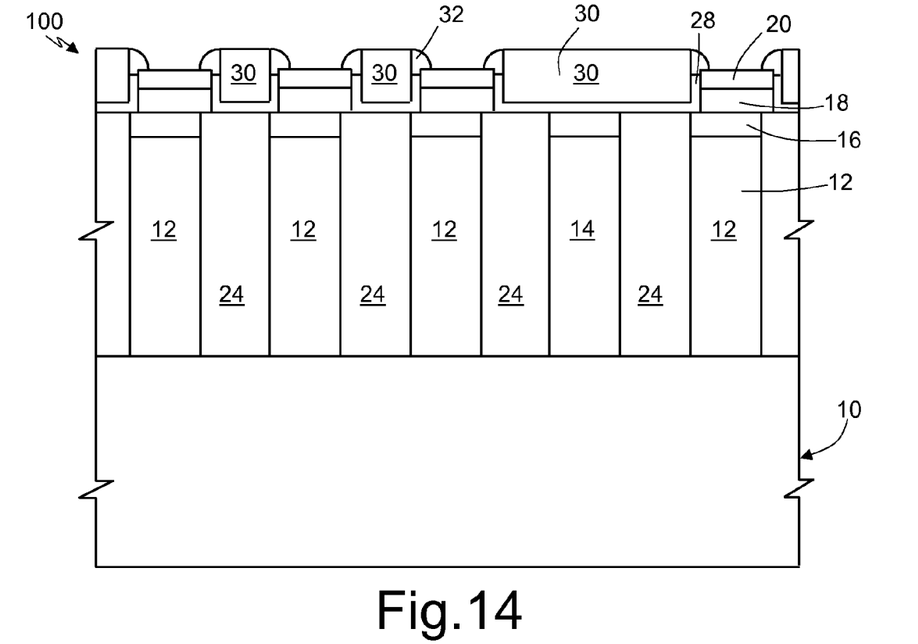

Then, in FIG. 14, metallic spacers 32 may be formed by depositing a suitable metal, such as tungsten, and performing an anisotropic spacer formation etch. The metal spacers 32 land on the stop layer 20.

Figure 15:
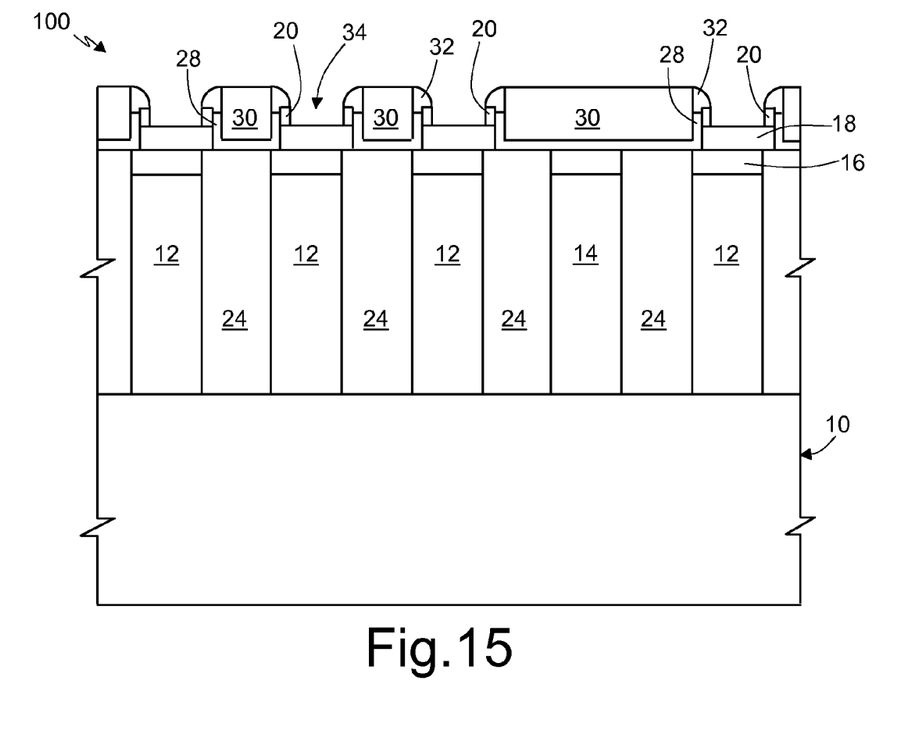

Then, as shown in FIG. 15, the stop layer 20 is mostly etched away, exposing the segmented heaters 18 through a sublithographic width pore 34. By "sublithographic" it is intended to refer to a dimension which is smaller than what can be formed with lithographic techniques. Currently, lithographic techniques can form dimensions of about 45 nanometers. In one embodiment, the width of the pore 34 may be on the order of 10 to 20 nanometers.

Figure 16:
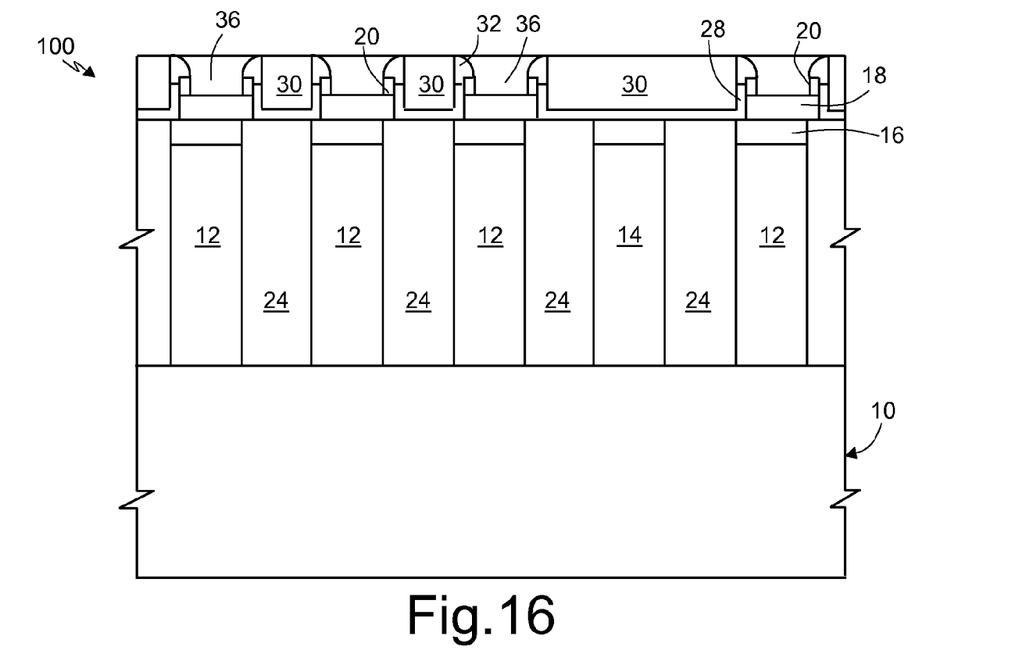

Then, turning to FIG. 16, a chalcogenide layer 36 may be deposited and planarized. The chalcogenide layer 36, in one embodiment, may be the phase change material sometimes referred to as GST, including germanium, antimony, and tellurium.

Finally, conventional process steps may be utilized to complete the memory. For instance, a dielectric layer (not shown) that is a composite layer of nitride and oxide may be deposited. A contact (not shown) may be dropped at a strap region, landing on the shoulder of the metallic spacer 32. Separate lithography and etch steps may be used to drop contacts to the raised bases 14.

Figure 17:
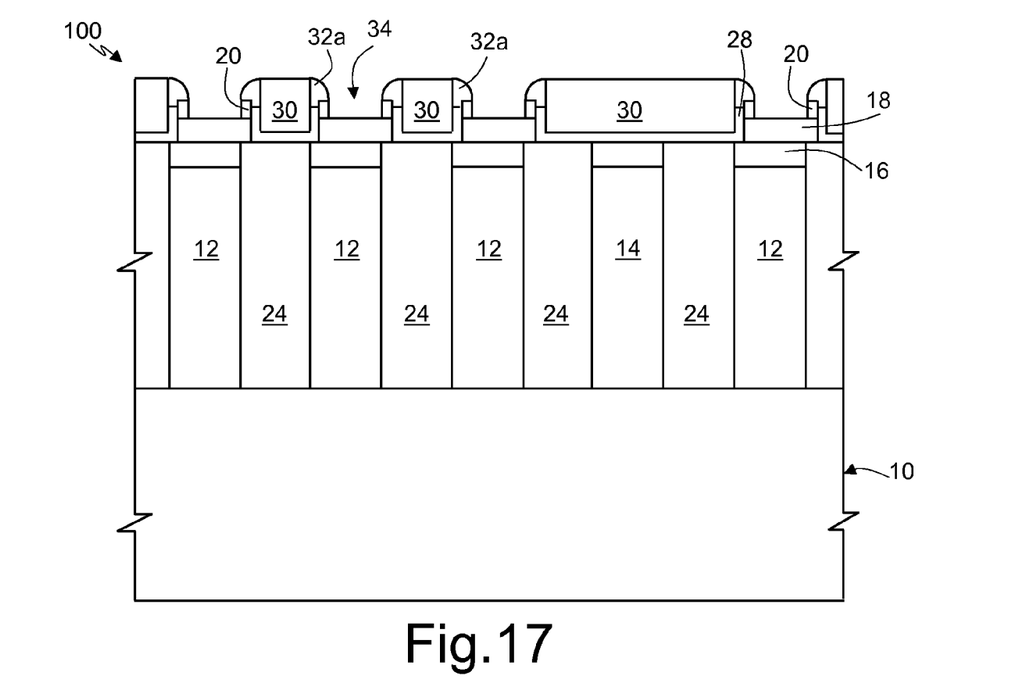
FIGS. 17-20 are enlarged, cross-sectional views at subsequent manufacturing steps along direction X in accordance with another embodiment.

In accordance with a different embodiment, the sequence illustrated in FIGS. 1-13 may be repeated. Then, a dielectric spacer 32a (FIG. 17) may be formed. The spacer 32a may be formed of nitride instead of the metallic spacer 32 of FIG. 14. Then, using the dielectric spacer 32a as a mask (instead of the metallic spacer 32), the stop layer 20 is etched to form the sublithographic aperture 34, as shown in FIG. 17.

Figure 18:
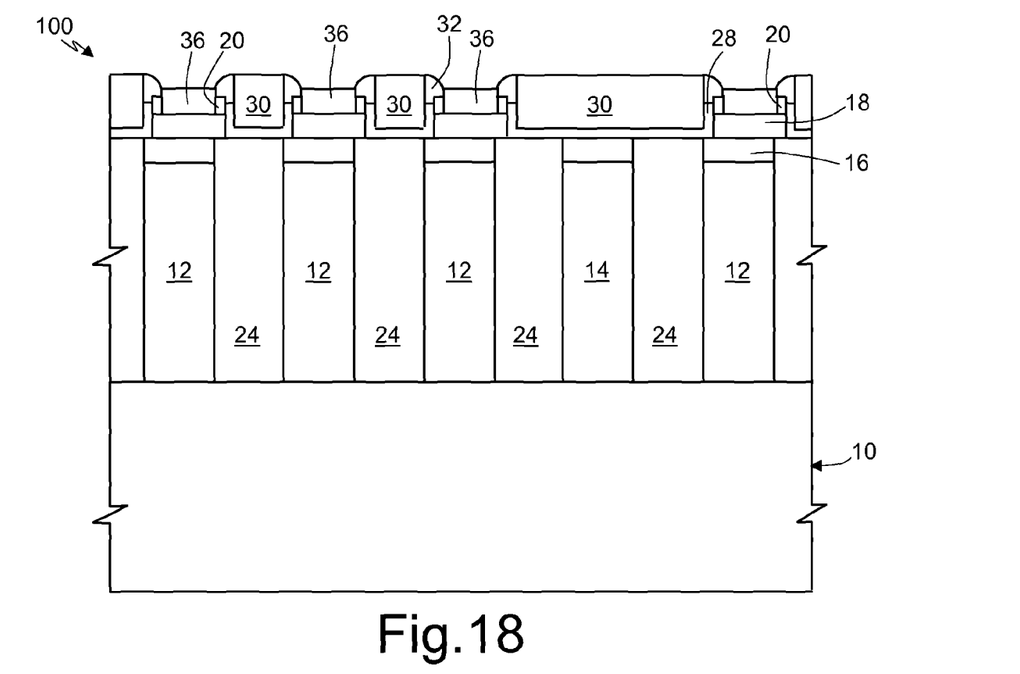

Then, as shown in FIG. 18, a chalcogenide layer 36 is deposited and then brought back below the spacer top surface. In one embodiment, an etch-back of the chalcogenide 34 may use a dry etch back process.

Figure 19:
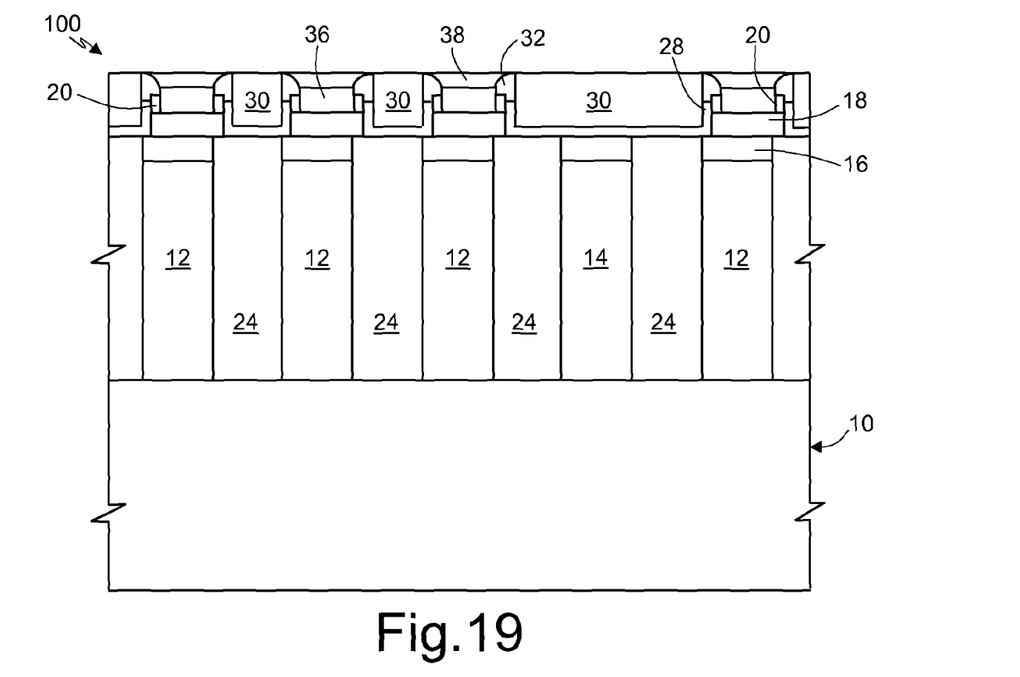

Referring next to FIG. 19, a metallic cap layer 38 may be deposited and planarized. The cap layer 38 may be a Ti/TiN composite layer, as one example.

The remaining process steps may be as conventional. For example, a dielectric layer (not shown) that is a composite of nitride and oxide may be deposited. A contact may be dropped to a strap region, landing on the metallic cap layer. Separate lithography and etch steps may be used to drop contacts to bases.

In some embodiments, three critical lithography steps of prior art methods can be reduced to one lithography step combined with self-aligned features. Phase change memory cells may be closer to a four $F^2$ cell area plus the base contact area overhead because the cell width is defined by 2 F in the segmented heater process, while cell height is defined by another 2 F in the shallow trench isolation region between base diffusion strips.

Programming of the chalcogenide material 36 to alter the state or phase of the material may be accomplished by applying voltage potentials through a select device, formed on a substrate, thereby generating a voltage potential across the memory element. When the voltage potential is greater than the threshold voltage of memory element, then an electrical current may flow through the chalcogenide material 36 in response to the applied voltage potentials, and may result in heating of the chalcogenide material 36 by the segmented heater 18.

This heating may alter the memory state or phase of the chalcogenide material 36. Altering the phase or state of the chalcogenide material 36 may alter the electrical characteristic of memory material, e.g., the resistance of the material may be altered by altering the phase of the memory material. Memory material may also be referred to as a programmable resistive material.

In the "reset" state, memory material 36 may be in an amorphous or semi-amorphous state and in the "set" state, memory material may be in a crystalline or semi-crystalline state. Both "reset" and "set" states can exist without any energy (electrical, optical, mechanical) applied to bistable chalcogenide. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material 36 may be heated to a relatively higher temperature to amorphosize the memory material and "reset" the memory material (e.g., program the memory material to a logic "0" value). Heating the volume of memory material to a relatively lower crystallization temperature may crystallize the memory material and "set" the memory material (e.g., program the memory material to a logic "1" value). Various resistances of the memory material may be achieved to store information by varying the amount of current flow and duration through the volume of memory material.

Figure 20:
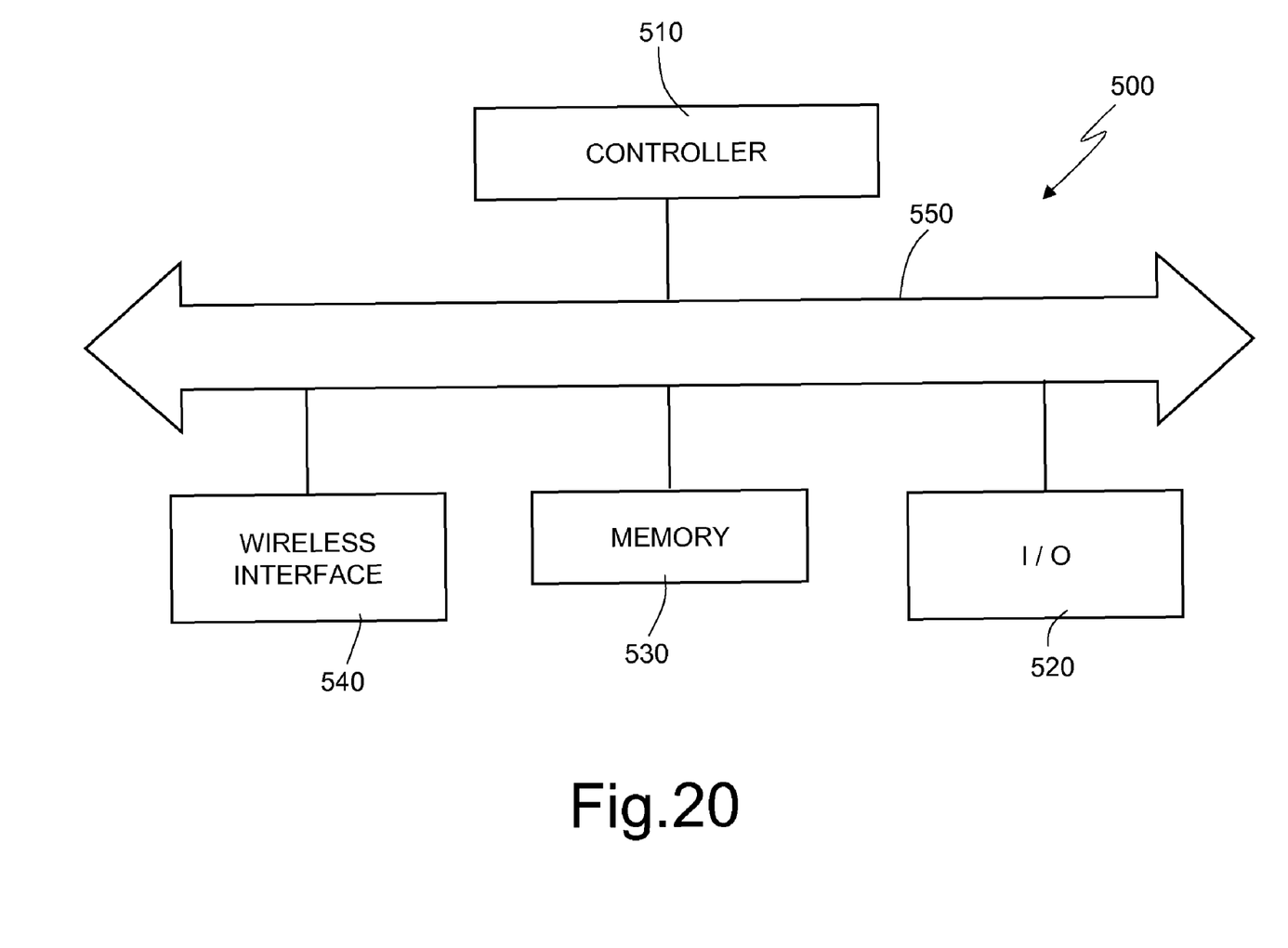

Turning to FIG. 20, a portion of a system 500 in accordance with an embodiment of the present invention is described. System 500 may be used in wireless or mobile devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g., a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A memory comprising:
   a substrate;
   segmented heaters over said substrate;
   first stop layer edge portions positioned respectively on respective first edges of the heaters;
   second stop layer edge portions positioned respectively on respective second edges of the heaters, each first stop layer edge portion being spaced apart from each second stop layer edge portion;
   first sidewall spacers positioned respectively over the first stop layer edge portions, each first stop layer edge portion being positioned between a corresponding one of the first sidewall spacers and a corresponding one of the first edges of said segmented heaters;
   second sidewall spacers positioned respectively over the second stop layer edge portions, each second stop layer edge portion being positioned between a corresponding one of the second sidewall spacers and a corresponding one of the second edges of said segmented heaters, respective pairs of the first and second sidewall spacers and respective pairs of the first and second stop layer edge portions defining respective sublithographic pores, each pore being defined on a first side by a respective one of the first stop layer edge portions and the corresponding one of the first sidewall spacers, and each pore being defined on a second side opposite to the first side, by a respective one of the second stop layer edge portions and the corresponding one of the second sidewall spacers; and
   chalcogenide memory regions in said pores.

2. The memory of claim 1 wherein said sidewall spacers are conductive.

3. The memory of claim 1 wherein said sidewall spacers are dielectric.

4. The memory of claim 1 wherein said sidewall spacers are conductive and the chalcogenide memory regions totally fill said pores.

5. The memory of claim 1 wherein said sidewall spacers are dielectric, said chalcogenide memory regions filling lower portions of said pores, the memory including conductive caps filling upper portions of said pores, respectively.

6. A system comprising:
   a processor;
   a memory coupled to said processor, said memory including
   a substrate;
   segmented heaters over said substrate;
   first stop layer edge portions positioned respectively on respective first edges of the heaters;
   second stop layer edge portions positioned respectively on respective second edges of the heaters, each first stop layer edge portion being spaced apart from each second stop layer edge portion;
   first sidewall spacers positioned respectively over the first stop layer edge portions, each first stop layer edge portion being positioned between a corresponding one of the first sidewall spacers and a corresponding one of the first edges of said segmented heaters;
   second sidewall spacers positioned respectively over the second stop layer edge portions, each second stop layer edge portion being positioned between a corresponding one of the second sidewall spacers and a corresponding one of the second edges of said segmented heaters, respective pairs of the first and second sidewall spacers and respective pairs of the first and second stop layer edge portions defining respective sublithographic pores, each pore being defined on a first side by a respective one of the first stop layer edge portions and the corresponding one of the first sidewall spacers, and each pore being defined on a second side, opposite to the first side, by a respective one of the second stop layer edge portions and the corresponding one of the second sidewall spacers; and
   chalcogenide memory regions in said pores.

7. The system of claim 6 wherein said sidewall spacers are conductive.

8. The system of claim 6 wherein said sidewall spacers are dielectric.

9. The system of claim 6 wherein said sidewall spacers are conductive and the chalcogenide memory regions totally fill said pores, respectively.

10. The system of claim 6 wherein said sidewall spacers are dielectric, said chalcogenide memory regions filling lower portions of said pores, respectively, the memory including conductive caps filling upper portions of said pores, respectively.

11. A memory cell comprising:
    a substrate;
    a heater over said substrate;
    first and second stop layer edge portions spaced apart from each other and respectively contacting first and second edges of the heater;

a first sidewall spacer positioned on the first stop layer edge portion, the first stop layer edge portion being positioned between the first sidewall spacer and the first edge of said heater;
a second sidewall spacer positioned on the second stop layer edge portion, the second stop layer edge portion being positioned between the second sidewall spacer and the second edge of said heater, the first sidewall spacer and the first stop layer edge portion defining a first side of a sublithographic pore and the second sidewall spacer and the second stop layer edge portion defining a second side of a sublithographic pore, the second side being opposite to the first side; and
a chalcogenide memory region in said pore.

12. The memory cell of claim 11 wherein said sidewall spacers are conductive.

13. The memory cell of claim 11 wherein said sidewall spacers are dielectric.

14. The memory cell of claim 11 wherein said sidewall spacers are conductive and the chalcogenide memory region totally fills said pore.

15. The memory cell of claim 11 wherein said sidewall spacers are dielectric, said chalcogenide memory regions fills a lower portion of said pore, and the memory cell includes a conductive cap filling an upper portion of said pore.

* * * * *